(12) United States Patent
Ren et al.

(10) Patent No.: US 10,025,152 B2
(45) Date of Patent: Jul. 17, 2018

(54) ANTI-ELECTROSTATIC DEVICE AND METHOD FOR MANUFACTURING THE SAME, AND ARRAY SUBSTRATE

(71) Applicants: BOE Technology Group Co., Ltd., Beijing (CN); Hefei Xinsheng Optoelectronics Technology Co., Ltd., Anhui (CN)

(72) Inventors: Xingfeng Ren, Beijing (CN); Senlin Wang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/629,975

(22) Filed: Jun. 22, 2017

(65) Prior Publication Data
US 2017/0293189 A1 Oct. 12, 2017

Related U.S. Application Data

(63) Continuation-in-part of application No. PCT/CN2016/094107, filed on Aug. 9, 2016.

(30) Foreign Application Priority Data

Jan. 5, 2016 (CN) .......................... 2016 1 0005081

(51) Int. Cl.
*H01L 29/10* (2006.01)
*G02F 1/1362* (2006.01)
(Continued)

(52) U.S. Cl.
CPC ...... *G02F 1/136204* (2013.01); *G02F 1/1368* (2013.01); *G02F 1/13439* (2013.01);
(Continued)

(58) Field of Classification Search
CPC ......... G02F 1/136204; G02F 1/134309; G02F 1/13439; G02F 1/1368;
(Continued)

(56) References Cited

U.S. PATENT DOCUMENTS 4,928,161 A 5/1990 Kobayashi
6,011,309 A 1/2000 Ahn
(Continued)

FOREIGN PATENT DOCUMENTS

| CN | 103928469 A | 7/2014 |
|---|---|---|
| CN | 103943632 A | 7/2014 |
| CN | 105607366 A | 5/2016 |

OTHER PUBLICATIONS

International Search Report and Written Opinion for International Application No. PCT/CN2016/094107, dated Oct. 31, 2016, 11 pages.
(Continued)

*Primary Examiner* — Tu-Tu Ho
(74) *Attorney, Agent, or Firm* — Westman, Champlin & Koehler, P.A.

(57) ABSTRACT

An anti-electrostatic device used in an array substrate of a liquid crystal display and a method for manufacturing the same, and a substrate are disclosed. The method includes steps of: forming a first insulation layer on a first conductive layer; forming a pattern on the first insulation layer; forming an etching barrier layer on the pattern; forming a first via hole and a second via hole extending through the etching barrier layer, and forming a fifth via hole extending through the etching barrier layer and the first insulation layer; forming a second conductive layer on the etching barrier layer, wherein a first portion and a second portion of the second conductive layer are respectively electrically connected to the pattern via the first via hole and the second via (Continued)

hole, and one of them is electrically connected to the first conductive layer via a fifth via hole.

20 Claims, 9 Drawing Sheets

(51) Int. Cl.
| | |
|---|---|
| *H01L 27/02* | (2006.01) |
| *H01L 27/12* | (2006.01) |
| *H01L 21/4763* | (2006.01) |
| *H01L 29/24* | (2006.01) |
| *H01L 29/45* | (2006.01) |
| *H01L 21/4757* | (2006.01) |
| *G02F 1/1343* | (2006.01) |
| *G02F 1/1368* | (2006.01) |
| *H01L 29/786* | (2006.01) |
| *H01L 29/861* | (2006.01) |
| *H01L 29/66* | (2006.01) |

(52) U.S. Cl.
CPC .. *G02F 1/134309* (2013.01); *H01L 21/47573* (2013.01); *H01L 21/47635* (2013.01); *H01L 27/0255* (2013.01); *H01L 27/124* (2013.01); *H01L 27/1225* (2013.01); *H01L 27/1262* (2013.01); *H01L 29/24* (2013.01); *H01L 29/45* (2013.01); *G02F 2001/134318* (2013.01); *G02F 2201/123* (2013.01); *G02F 2202/10* (2013.01); *H01L 29/66969* (2013.01); *H01L 29/7869* (2013.01); *H01L 29/861* (2013.01)

(58) Field of Classification Search
CPC ... G02F 2001/134318; G02F 2201/123; G02F 2202/10; H01L 21/47573; H01L 21/47635; H01L 27/0255; H01L 27/1225; H01L 27/124; H01L 27/1262; H01L 29/24; H01L 29/45; H01L 29/66969; H01L 29/7869; H01L 29/861
USPC .......................................................... 257/43
See application file for complete search history.

(56) References Cited

U.S. PATENT DOCUMENTS

| | | | |
|---|---|---|---|
| 9,470,916 B2 | 10/2016 | Cao et al. | |
| 2002/0130983 A1* | 9/2002 | Konishi | .............. G02F 1/13458 349/43 |
| 2005/0173734 A1* | 8/2005 | Yoshioka | ............ H01L 29/4908 257/202 |

OTHER PUBLICATIONS

English translation of International Search Report and Written Opinion for International Application No. PCT/CN2016/094107, dated Oct. 31, 2016, 13 pages.

* cited by examiner

ANTI-ELECTROSTATIC DEVICE AND METHOD FOR MANUFACTURING THE SAME, AND ARRAY SUBSTRATE

CROSS-REFERENCE TO RELATED APPLICATION

This application is a continuation-in-part of International Application No. PCT/CN2016/094107, filed on 9 Aug. 2016, and claims priority to Chinese Patent Application No. 201610005081.3 filed on Jan. 5, 2016, entitled "ANTI-ELECTROSTATIC DEVICE AND METHOD FOR MANUFACTURING THE SAME, AND SUBSTRATE" in the State Intellectual Property Office of China, the contents of which are incorporated herein by reference in their entirety.

BACKGROUND

Technical Field

Embodiments of the present disclosure relate to an anti-electrostatic device, a method for manufacturing the anti-electrostatic device and an array substrate including the anti-electrostatic device.

Description of the Related Art

An array substrate of a liquid crystal display includes a pixel unit and a thin film transistor for driving the pixel unit. In general, during production of a thin film transistor, it may generate static electricity on different conductive layers of the thin film transistor due to friction and the like. An electrostatic breakdown phenomenon will occur if the static electricity has been accumulated to a certain degree. As a result, it will damage a pixel circuit on the array substrate due to short circuit.

In order to prevent the electrostatic breakdown phenomenon, it is generally necessary to form an anti-electrostatic device while manufacturing the thin film transistor, so as to avoid the electrostatic breakdown phenomenon between the different conductive layers. FIG. 1 is a cross-section view of an anti-electrostatic device in the prior art. As shown in FIG. 1, the anti-electrostatic device mainly includes a first conductive layer 11, a first insulation layer 12 formed on the first conductive layer 11, a second conductive layer 15 formed on the first insulation layer 12, a second insulation layer 16 formed on the second conductive layer 15, a via hole 02 formed in the second insulation layer 16, a via hole 03 extending through the second insulation layer 16 and the first insulation layer 12, and a third conductive layer 17 formed on the second insulation layer 16.

As shown in FIG. 1, in the prior art, the second conductive layer 15 of the anti-electrostatic device is electrically connected to the third conductive layer 17 by the via hole 02, and the third conductive layer 17 is electrically connected to the first conductive layer 11 by the via hole 03. Therefore, in the prior art, the second conductive layer 15 and the first conductive layer 11 are electrically isolated from each other before the third conductive layer 17 is formed. In this case, there is a voltage difference between the second conductive layer 15 and the first conductive layer 11 before the formation of the third conductive layer 17 (since it may generate static electricity on the second conductive layer 15 and the first conductive layer 11 due to for example friction and the like, during the manufacturing process, the electrostatic breakdown phenomenon will occur if the static electricity has been accumulated to a certain extent). If the voltage difference is sufficiently high, the first insulation layer 12 between the second conductive layer 15 and the first conductive layer 11 may be broken down, which will cause the pixel circuit on the array substrate to be damaged due to the short circuit.

Thus, in the prior art, the electrostatic breakdown phenomenon is still present during the manufacture of the thin film transistor. The electrostatic breakdown can cause the pixel circuit on the array substrate in a display device to be damaged, and even cause the pixel circuit on the array substrate to be shorted, thereby the array substrate cannot work normally.

In addition, as shown in FIG. 1, in the prior art, the via hole 03 for electrically connecting the third conductive layer 17 and the first conductive layer 11 needs to extend through the first insulation layer 12 and the second insulation layer 16, which results in the via hole 03 to be of a relatively larger length and difficultly in terms of making Sometimes, the actually formed via hole 03 cannot extend through the first insulation layer 12 and the second insulation layer 16 completely. In such a case, the third conductive layer 17 is not allowed to be electrically connected to the first conductive layer 11, thereby increasing the probability of electrical OPEN (or disconnection) between the third conductive layer 17 and the first conductive layer 11.

SUMMARY

The present disclosure aims to address at least one aspect of the above-described problems and defects in the prior art.

According to an objective of the present disclosure, there is provided an anti-electrostatic device, which is capable of eliminating potential differences between different conductive layers and effectively preventing electrostatic breakdown phenomenon between the different conductive layers.

According to another objective of the present disclosure, there is provided an anti-electrostatic device, which is capable of reducing a length of a via hole for connecting two conductive layers to each other and effectively reducing the probability of electrical open between the two conductive layers.

According to an aspect of the present disclosure, there is provided an anti-electrostatic device used in an array substrate of a liquid crystal display, comprising: a first conductive layer; a first insulation layer formed on the first conductive layer; a pattern formed on the first insulation layer, the pattern being formed in a same layer as an active layer of a thin film transistor in the array substrate and having an electric conductivity; an etching barrier layer formed on the pattern; a second conductive layer formed on the etching barrier layer and comprising a first portion and a second portion spaced apart from each other; a second insulation layer formed on the second conductive layer; and a third conductive layer formed on the second insulation layer, wherein the first portion and the second portion of the second conductive layer are respectively electrically connected to the pattern via a first via hole and a second via hole formed in the etching barrier layer, and respectively electrically connected to the third conductive layer via a third via hole and a fourth via hole formed in the second insulation layer; wherein one of the first portion and the second portion of the second conductive layer is electrically connected to the first conductive layer via a fifth via hole extending through the etching barrier layer and the first insulation layer.

According to another aspect of the present disclosure, there is provided an array substrate for a liquid crystal display comprising the above-described anti-electrostatic device.

According to a further aspect of the present disclosure, there is provided a method for manufacturing an anti-electrostatic device used in an array substrate of a liquid crystal display, comprising steps of:

forming a first insulation layer on a first conductive layer;

forming a pattern on the first insulation layer, the pattern being formed in a same layer as an active layer of a thin film transistor in the array substrate and having an electric conductivity;

forming an etching barrier layer on the pattern;

forming a first via hole and a second via hole extending through the etching barrier layer, and forming a fifth via hole extending through the etching barrier layer and the first insulation layer;

forming a second conductive layer on the etching barrier layer, wherein a first portion and a second portion of the second conductive layer are respectively electrically connected to the pattern via the first via hole and the second via hole, and one of the first portion and the second portion of the second conductive layer is electrically connected to the first conductive layer via a fifth via hole;

forming the second insulation layer on the second conductive layer;

forming the third via hole and the fourth via hole extending through the second insulation layer; and forming the third conductive layer on the second insulation layer, wherein the third conductive layer is electrically connected to the first portion and the second portion of the second conductive layer via the third via hole and the fourth via hole.

In the anti-electrostatic device according to various above-described embodiments of the present disclosure, the second conductive layer is electrically connected to the first conductive layer via a single via hole, thus potential difference between the second conductive layer and the first conductive layer in the process of production may be timely eliminated, thereby effectively preventing the electrostatic breakdown phenomenon during the production process.

In an exemplary embodiment of the present disclosure, the pattern in the above-described anti-electrostatic device may be synchronously formed form the same or different materials while an active layer of a thin film transistor is manufactured, so that the electrostatic breakdown between different conductive layers may be avoided during the manufacture of the thin film transistor.

In addition, in the various above-described embodiments of the present disclosure, the via hole for connecting two conductive layers to each other only needs to extend through one insulation layer, therefore, it reduces the length of the via hole for connecting the two conductive layers to each other, and reduces the probability of electrical open between the two conductive layers.

Other objectives and advantages of the present disclosure will become apparent and a comprehensive understanding of the present disclosure will be given upon the following description of the present disclosure with reference to the accompanying drawings.

DETAILED DESCRIPTION OF PREFERRED EMBODIMENTS

Figure 1:
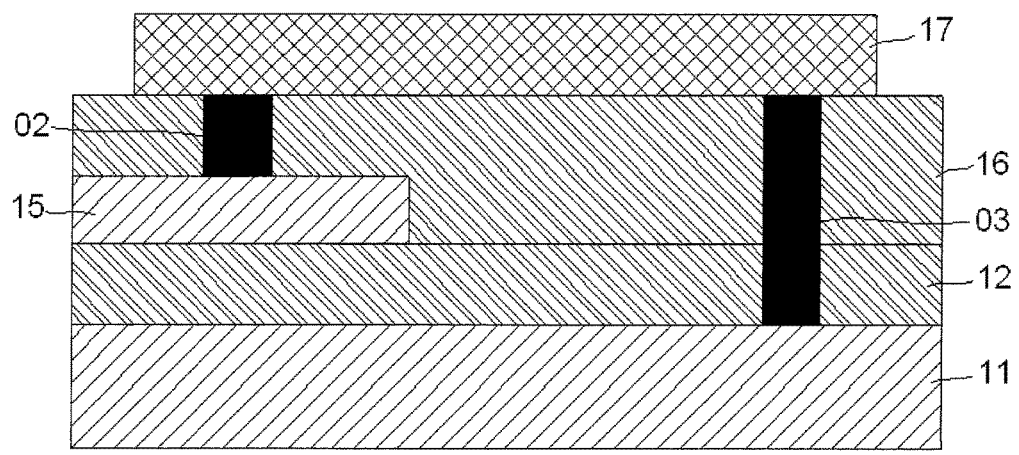
FIG. 1 is a cross-section view of an anti-electrostatic device in the prior art.

The technical solution of the present disclosure will be described in further detail in view of the following embodiments, with reference to the accompanying drawings. In the specification, the same or similar reference numerals indicate the same or similar parts. The following description of embodiments of the present disclosure with reference to the accompanying drawings is intended to explain the general inventive concept of the present disclosure, but should not be construed as limiting the present disclosure.

In addition, in the following detailed description, for ease of explanation, numerous specific details are set forth in order to provide a comprehensive understanding of the embodiments of the present disclosure. However, it will be apparent that one or more embodiments may also be practiced without these specific details. In other instances, well-known structures and devices are illustrated by way of illustration to simplify the drawings.

According to a general concept of the present disclosure, there is provided an anti-electrostatic device used in an array substrate of a liquid crystal display, including: a first conductive layer; a first insulation layer formed on the first conductive layer; a pattern formed on the first insulation layer, the pattern being formed in a same layer as an active layer of a thin film transistor in the array substrate and having an electric conductivity; an etching barrier layer formed on the pattern; a second conductive layer formed on the etching barrier layer and comprising a first portion and a second portion spaced apart from each other;

wherein the first portion and the second portion of the second conductive layer are respectively electrically connected to the pattern via a first via hole and a second via hole formed in the etching barrier layer;

wherein one of the first portion and the second portion of the second conductive layer is electrically connected to the first conductive layer via a fifth via hole extending through the etching barrier layer and the first insulation layer.

According to the above-described structure, in contrast to the prior art, the first conductive layer and the second conductive layer may be electrically connected to each other before the third conductive layer is provided, thus it can eliminate potential differences between the above two different conductive layers and effectively prevent an electrostatic breakdown phenomenon between the different conductive layers.

With the above structure, a second insulation layer formed on the second conductive layer and a third conductive layer formed on the second insulation layer are further provided.

The first portion and the second portion of the second conductive layer are respectively electrically connected to the third conductive layer via a third via hole and a fourth via hole formed in the second insulation layer.

In this way, the structure in which the first conductive layer is directly electrically connected to the third conductive layer in the prior art is replaced with the structure in which the second conductive layer is electrically connected to the third conductive layer, in combination with the above-described structure in which the second conductive layer is electrically connected to the first conductive layer. Thus, a via hole of a relatively larger length is avoided, and the probability of electrical open between the third conductive layer and the first conductive layer is reduced.

Figure 2:
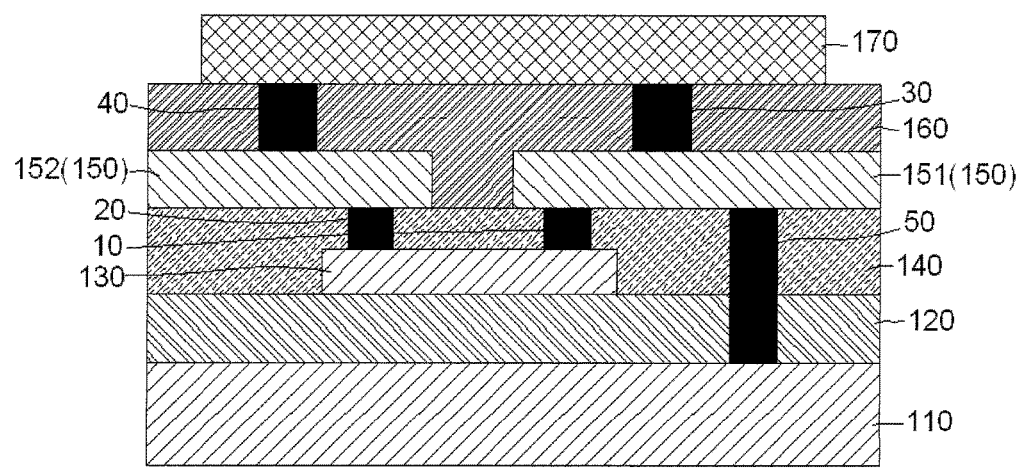
FIG. 2 is a cross-section view of an anti-electrostatic device according to an exemplary embodiment of the present disclosure.

FIG. 2 is a cross-section view of an anti-electrostatic device according to an exemplary embodiment of the present disclosure.

In the exemplary embodiment of the present disclosure, an anti-electrostatic device used in an array substrate of a liquid crystal display is disclosed. As shown in FIG. 2, the anti-electrostatic device mainly includes a first conductive layer 110, a first insulation layer 120, a pattern 130, an etching barrier layer 140, a second conductive layer 150, a second insulation layer 160 and a third conductive layer 170, wherein the pattern is formed in the same layer as an active layer for a thin film transistor (TFT) and has an electric conductivity.

It should be noted that, the pattern 130 formed in the same layer as the active layer for TFT and having the electric conductivity herein refers to a pattern, which is structurally located at the same level as the active layer of the TFT, is made of the same or different materials from the active layer of the TFT, and has a certain electric conductivity. It is only sure that the pattern 130 has an ability to remove static electricity between the first conductive layer, the second conductive layer and/or the third conductive layer as the present disclosure proposes, but it does not need the pattern 130 to have an identical or similar electric conductivity to an excellent conductor.

For example, in general, the active layer for the TFT and the pattern 130 of the anti-electrostatic device may be formed by the same one manufacturing process, in this way, they are formed from the same materials by the same process. Therefore, the manufacturing process is simplified. Alternatively, the pattern 130 of the anti-electrostatic device may be formed of different materials from the active layer of the TFT if desired.

As shown in FIG. 2, in the illustrated embodiment, the first insulation layer 120 is formed on the first conductive layer 110. The pattern 130 is formed on the first insulation layer 120 by a patterning process. The etching barrier layer 140 is formed on the pattern 130. The second conductive layer 150 is formed on the etching barrier layer 140, and the second conductive layer 150 includes a first portion 151 and a second portion 152 which are simultaneously formed by a single patterning process. The first portion 151 and the second portion 152 are spaced apart from each other. The second insulation layer 160 is formed on the second conductive layer 150. The third conductive layer 170 is formed on the second insulation layer 160.

Further referring to FIG. 2, in the illustrated embodiment, the first portion 151 and the second portion 152 of the second conductive layer 150 are respectively electrically connected to the pattern 130 via a first via hole 10 and a second via hole 20 formed in the etching barrier layer 140, and the first portion 151 and the second portion 152 of the second conductive layer 150 are respectively electrically connected to the third conductive layer 170 via a third via hole 30 and a fourth via hole 40 formed in the second insulation layer 160.

In the exemplary embodiment of the present disclosure, as shown in FIG. 2, one of the first portion 151 and the second portion 152 of the second conductive layer 150 is electrically connected to the first conductive layer 110 via a fifth via hole 50 extending through the etching barrier layer 140 and the first insulation layer 120. In the illustrated embodiment, the first portion 151 of the second conductive layer 150 is electrically connected to the first conductive layer 110 via the fifth via hole 50 extending through the etching barrier layer 140 and the first insulation layer 120. However, the present disclosure is not limited to the illustrated embodiment, for example, the positions of the first portion 151 and the second portion 152 of the second conductive layer 150 in FIG. 2 may be interchangeable.

In an embodiment of the present disclosure, as shown in FIG. 2, the third conductive layer 170 may be a transparent conductive layer made of indium tin oxide (ITO).

In an embodiment of the present disclosure, as shown in FIG. 2, the first insulation layer 120 and the second insulation layer 160 may be protective passivation layers made of an inorganic insulation material. For example, the first insulation layer 120 and the second insulation layer 160 may be made of silicon dioxide ($SiO_2$), silicon nitride ($SiN_x$), silicon oxynitride ($SiO_xN_y$), aluminum oxide ($Al_2O_3$) or titanium oxide ($TiO_x$).

In an embodiment of the present disclosure, as shown in FIG. 2, the pattern 130 may be a semiconductor layer made of an oxide semiconductor material, thus it has a certain electric conductivity. For example, the pattern 130 may be specifically made of indium gallium zinc oxide (IGZO), indium gallium tin oxide (IGTO) or indium zinc oxide (IZO).

Although not shown, according to another general concept of the present disclosure, there is provided a substrate including the above-described anti-electrostatic device. The substrate further includes an array substrate having an array of thin film transistors. FIGS. 3a-3h show processes for manufacturing the anti-electrostatic device shown in FIG. 2.

Figure 3A:
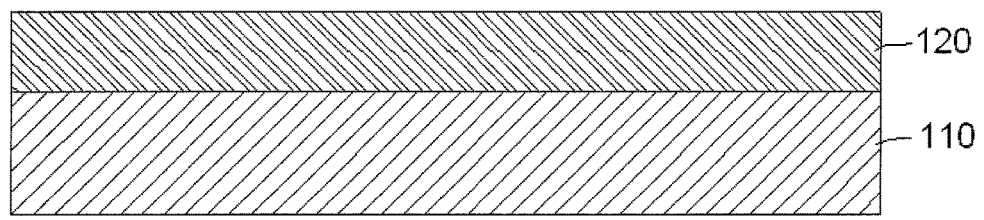
FIGS. 3a-3h show processes for manufacturing the anti-electrostatic device shown in FIG. 2.
Figure 3B:
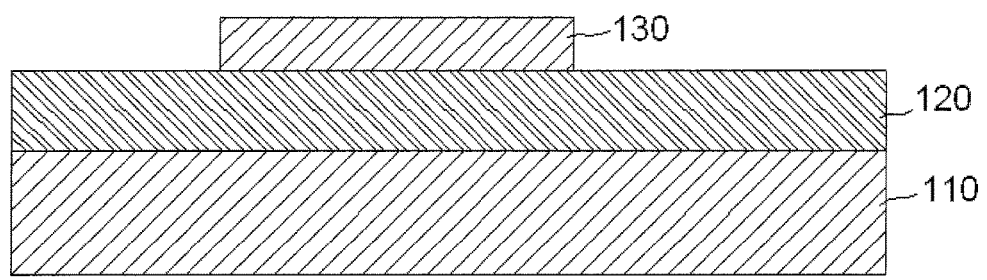
Figure 3C:
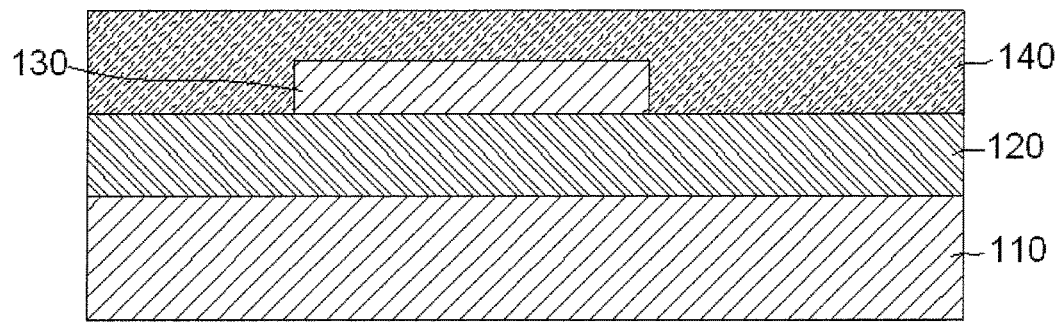
Figure 3D:
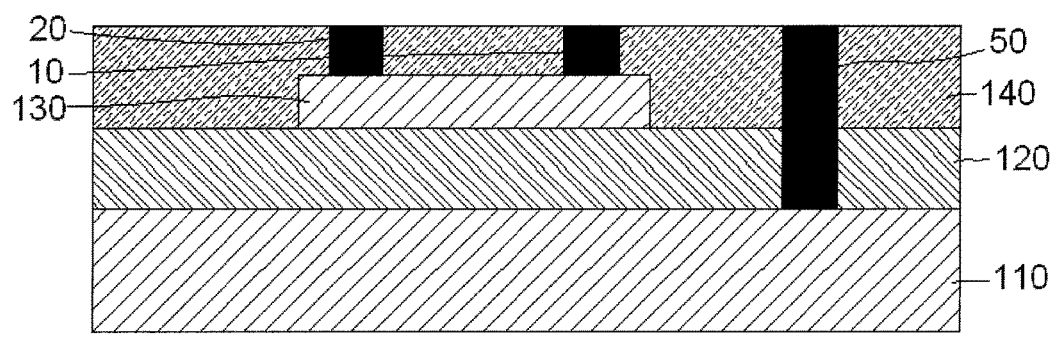
Figure 3E:
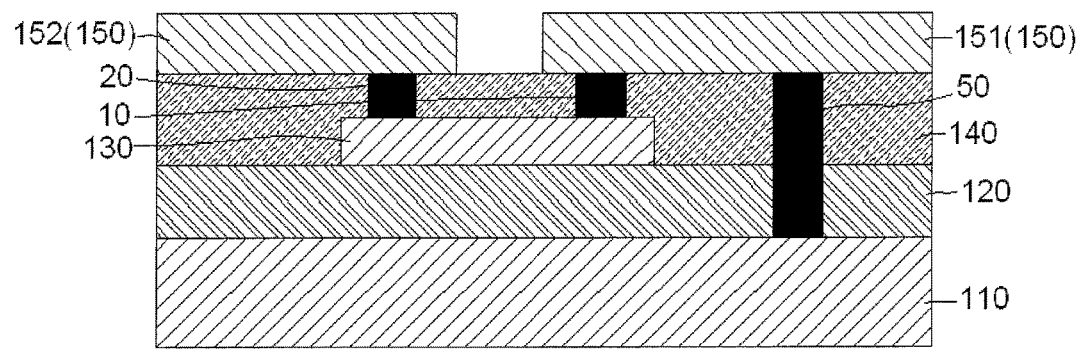
Figure 3F:
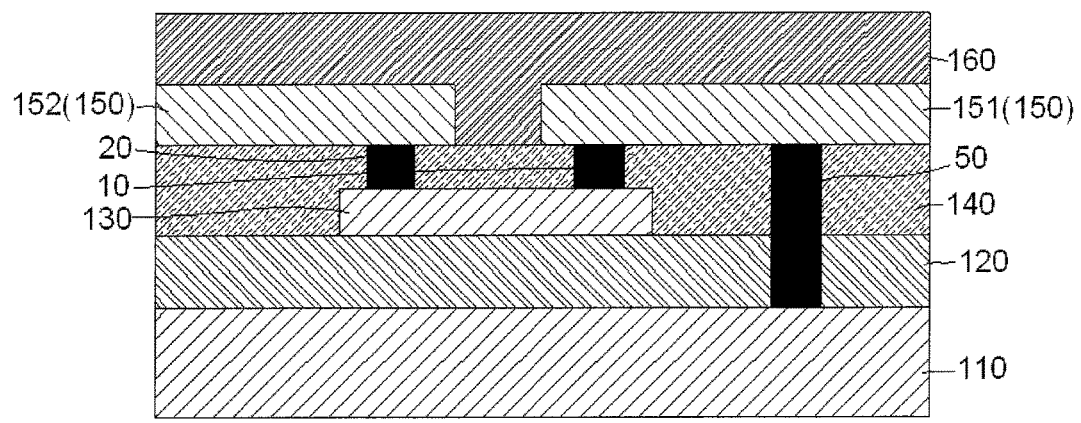
Figure 3G:
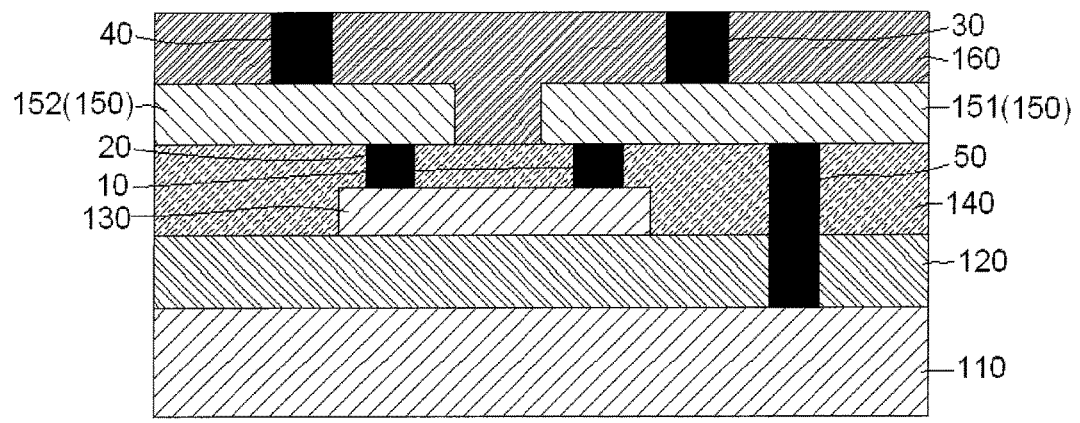
Figure 3H:
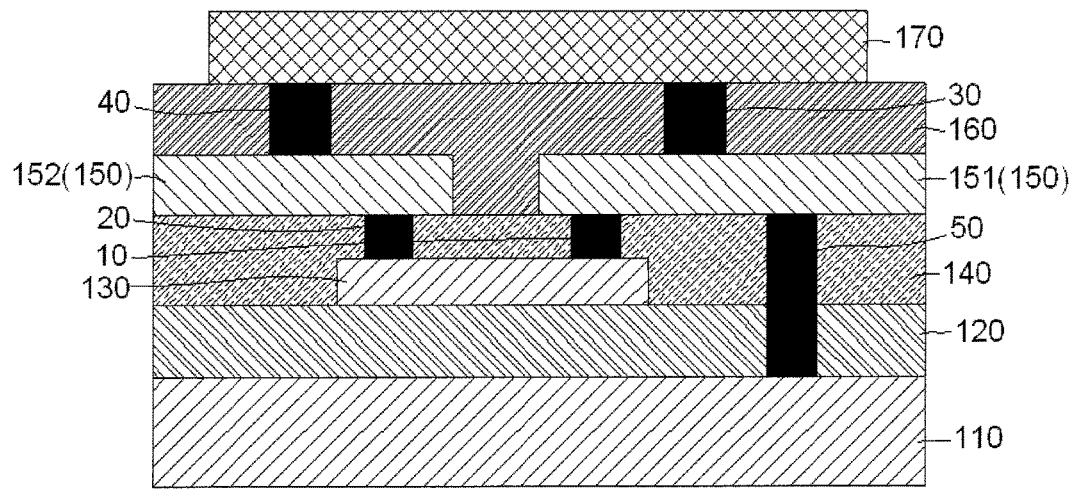

Next, the method for manufacturing the anti-electrostatic device used in an array substrate of a liquid crystal display shown in FIG. 2 will be described in detail with reference to FIG. 3, the method mainly includes steps of:

S110: forming the first insulation layer 120 on the first conductive layer 110, as shown in FIG. 3a;

S120: forming the pattern 130 on the first insulation layer 120, the pattern 130 being formed in a same layer as an active layer of a thin film transistor in the array substrate and having an electric conductivity, as shown in FIG. 3b, while the active layer (not shown) for the thin film transistor is also formed on the first insulation layer 120;

S130: forming the etching barrier layer 140 on the pattern 130, as shown in FIG. 3c;

S140: forming the first via hole 10 and the second via hole 20 extending through the etching barrier layer 140, and forming the fifth via hole 50 extending through the etching barrier layer 140 and the first insulation layer 120, as shown in FIG. 3d;

S150: forming the second conductive layer 150 on the etching barrier layer 140, as shown in FIG. 3e, wherein the first portion 151 and the second portion 152 of the second conductive layer 150 are respectively electrically connected to the pattern 130 via the first via hole 10 and the second via hole 20, and one of the first portion 151 and the second portion 152 of the second conductive layer 150 is electrically connected to the first conductive layer 110 via the fifth via hole 50;

S160: forming the second insulation layer 160 on the second conductive layer 150, as shown in FIG. 3f;

S170: forming the third via hole 30 and the fourth via hole 40 extending through the second insulation layer 160, as shown in FIG. 3g; and S180: forming the third conductive layer 170 on the second insulation layer 160, as shown in FIG. 3h, wherein the third conductive layer 170 is electrically connected to the first portion 151 and the second portion 152 of the second conductive layer 150 via the third via hole 30 and the fourth via hole 40.

In this way, the anti-electrostatic device as shown in FIG. 2 may be achieved.

In the above-described manufacturing processes, as shown in FIG. 3e, once the second conductive layer 150 is formed, the first portion 151 and the second portion 152 of the second conductive layer 150 are respectively electrically connected to the pattern 130 via the first via hole 10 and the second via hole 20, and one of the first portion 151 and the second portion 152 of the second conductive layer 150 is electrically connected to the first conductive layer 110 via the fifth via hole 50. In the illustrated embodiment, the first portion 151 of the second conductive layer 150 is electrically connected to the first conductive layer 110 via a single fifth via hole 50, so that the first portion 151 of the second conductive layer 150 and the first conductive layer 110 are located at the same potential. At this time, if there is a potential difference between the first portion 151 and the second portion 152 of the second conductive layer 150, the pattern 130 will be switched on, which causes the first portion 151 and the second portion 152 of the second conductive layer 150 and the first conductive layer 110 are all at the same potential, thereby eliminating the potential difference between the second conductive layer 150 and the first conductive layer 110 and effectively preventing the electrostatic breakdown phenomenon between the different conductive layers during the production process.

In an exemplary embodiment of the present disclosure, the above-described pattern in the anti-electrostatic device may be synchronously formed while the active layer of the thin film transistor is manufactured, so that the electrostatic breakdown between different conductive layers may be avoided during the manufacture of the thin film transistor, for example, the electrostatic breakdown between a source-drain layer and a gate electrode of the thin film transistor may be avoided during the manufacture of the thin film transistor.

In the various above-described embodiments of the present disclosure, as shown in FIGS. 3g and 3h, the via holes 30, 40 for connecting the third conductive layer 170 to the second conductive layer 150 only extend through the second insulation layer 160, but does not extend through both the first insulation layer 120 and the second insulation layer 160. Therefore, it reduces the length of the via holes 30, 40 for connecting the third conductive layer 170 to the second conductive layer 150 (the length thereof is much less than the length of the via hole 03 in the prior art shown in FIG. 1), and reduces the probability of the electrical open of the third conductive layer.

In the various above-described embodiments of the present disclosure, as shown in FIGS. 3d and 3e, since the length of the fifth via hole 50 for electrically connecting the second conductive layer 150 to the first conductive layer 110 is relatively small (the length thereof is much less than the length of the via hole 03 in the prior art shown in FIG. 1), the fifth via hole 50 is easily formed, the manufacturing difficulty is reduced, and it can ensure that the second conductive layer 150 and the first conductive layer 110 can be reliably electrically connected to each other.

In the above-described embodiments of the present disclosure, as shown in FIG. 3d, the first via hole 10 and the second via hole 20 are etched from a top surface of the etching barrier layer 140 to the pattern 130, and the fifth via hole 50 is etched from the top surface of the etching barrier layer 140 to a top surface of the first conductive layer 110. Thus, after the first portion 151 and the second portion 152 of the second conductive layer 150 are formed, as shown in FIG. 3e, the first portion 151 and the second portion 152 of the second conductive layer 150 may be electrically connected to the first conductive layer 110 via a two-way conduction circuit constituted by the first via hole 10, the second via hole 20 and the fifth via hole 50, thereby eliminating the potential difference between the second conductive layer 150 and the first conductive layer 110 and effectively preventing the electrostatic breakdown phenomenon during the production process.

Figure 4A:
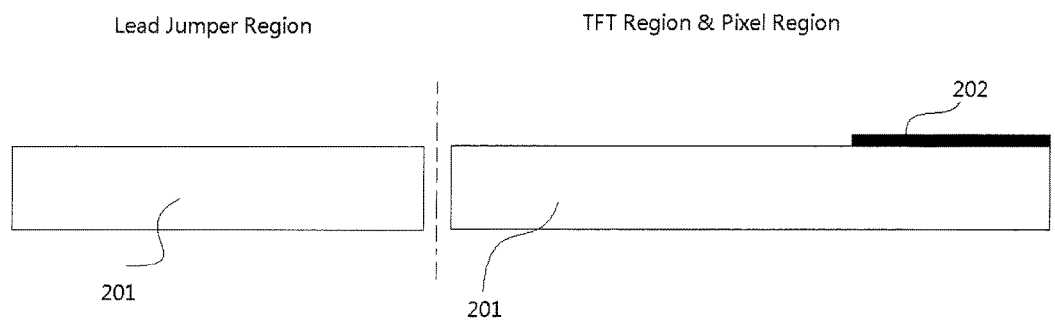
FIGS. 4a-4g show processes for manufacturing the anti-electrostatic device as shown in FIG. 2 while producing the thin film transistor.

Next, a method for manufacturing the anti-static device shown in FIG. 2 as used in an array substrate of a liquid crystal display will be described in detail with reference to FIGS. 4a-4g. The method mainly includes the following steps:

S210: a pixel electrode (such as an ITO layer) 202 is formed on a pixel region of the substrate 201; as shown in FIG. 4a, it should be understood that for example a glass substrate 201 is generally provided with a lead jumper region, a TFT region, a pixel region and any other function regions. Only these function regions are shown herein since they are involved in the present disclosure. Alternatively, any other function regions may be provided by those skilled in the art if required.

Figure 4B:
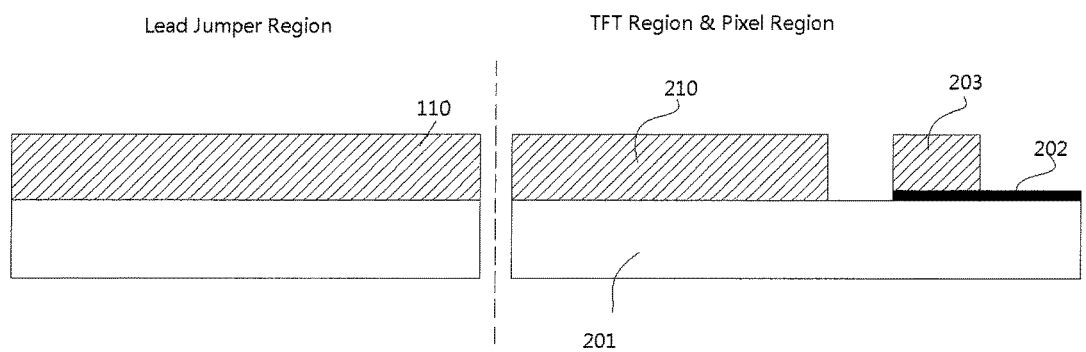

S220: on the basis of the step S210, a gate layer covering the whole substrate 201 is formed, and the first conductive layer 110 in the lead jumper region, a gate electrode 210 in the TFT region, and part of a lead 203 on the pixel electrode 202 in the pixel region are formed by a process such as a gate mask, as shown in FIG. 4b.

Figure 4C:
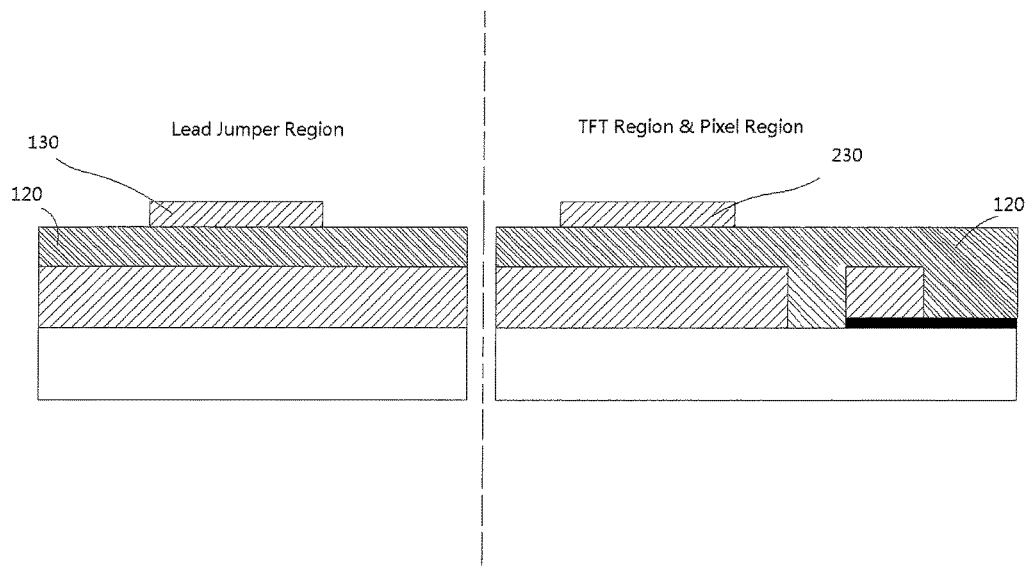

S230: on the basis of the step S220, the first insulation layer 120 covering the whole substrate 201 is formed, and the pattern 130 in the lead jumper region and an active layer 230 in the TFT region are formed on the first insulation layer 120 by a patterning process, as shown in FIG. 4c. It should be noted that, the pattern 130 of the anti-electrostatic device and the active layer 230 of the TFT in the array substrate are formed in the same layer and formed of the same materials.

Figure 4D:
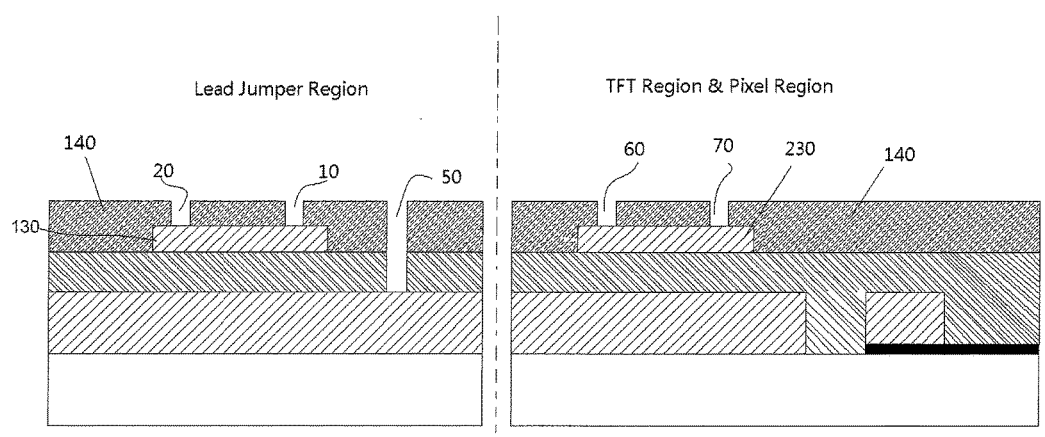
Figure 4E:
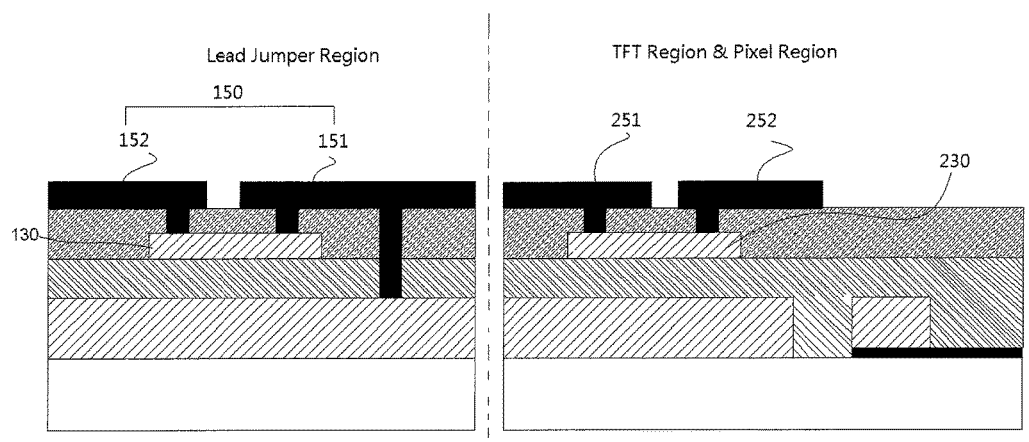

S240: on the basis of the step S230, the etching barrier layer 140 covering the whole substrate 201 is formed. By means of etching the etching barrier layer 140, the first via hole 10, the second via hole 20, and the fifth via hole 50 extending through the etching barrier layer 140 and the first insulation layer 120 are formed in the lead jumper region, and the etching barrier layer 140 is etched to the active layer 230 in the TFT region to form a sixth via hole 60 and a seventh via hole 70, as shown in FIG. 4d;

S250: on the basis of the step S240, by means of a process such as depositing, a source and drain mask and so on, the second conductive layer 150 is formed in the lead jumper region, and a source-drain electrode layer 251 and 252 are formed in the TFT region, as shown in FIG. 4e. In particular, the first portion 151 and the second portion 152 of the second conductive layer 150 are respectively electrically connected to the pattern 130 in the lead jumper region via the first via hole 10 and the second via hole 20, and one of the first portion 151 and the second portion 152 of the second conductive layer 150 (in this case, the first portion 151) is electrically connected to the first conductive layer 110 via the fifth via hole 50. The source electrode 251 in the source and drain electrode layer is connected to the active layer 230 in the TFT region via the sixth via hole 60, while the drain electrode 252 is connected to the active layer 230 in the TFT region via the seventh via hole 70.

Figure 4F:
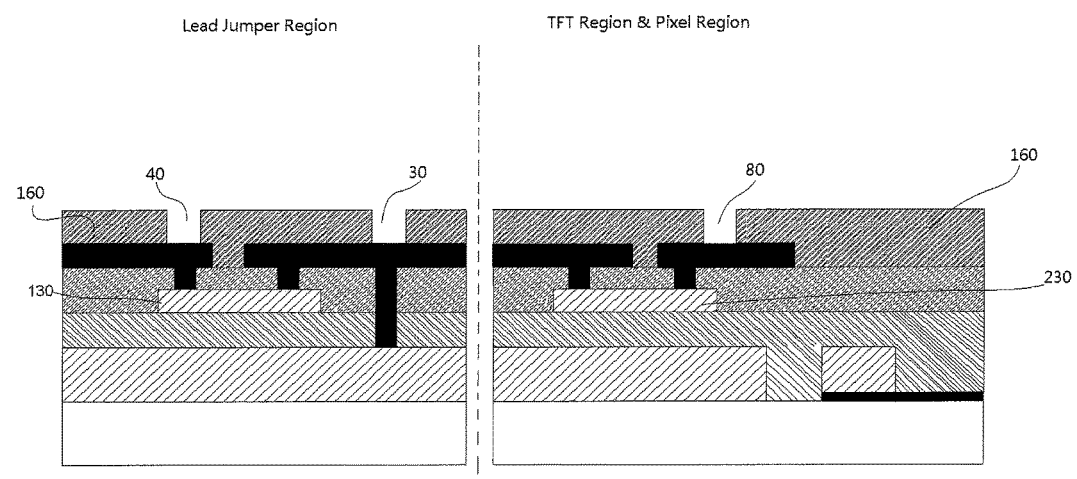
Figure 4G:
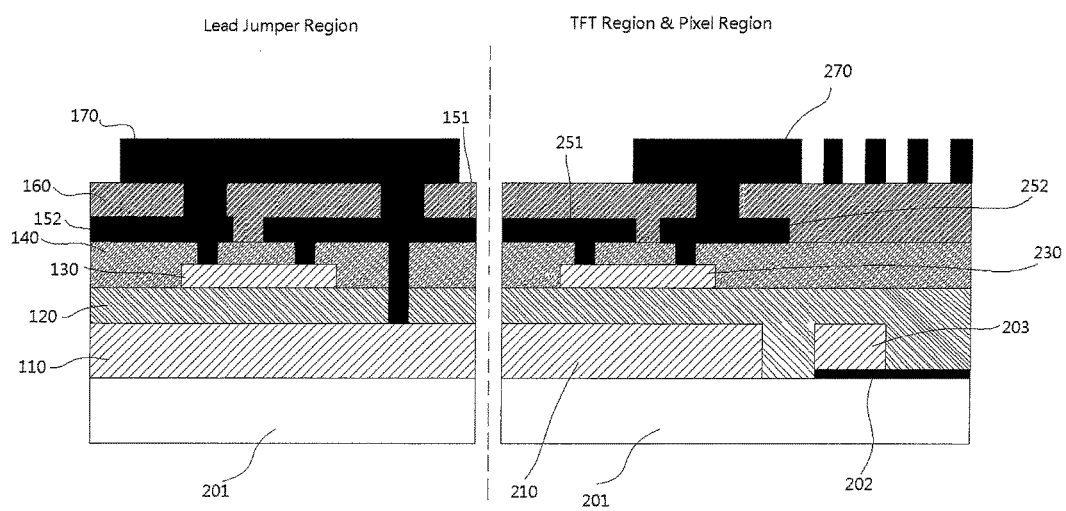

S260: on the basis of the step S250, the second insulation layer 160 covering the whole substrate 201 is formed, and the third via hole 30 and the fourth via hole 40 extending through the second insulation layer 160 are formed in the lead jump region, and an eighth via hole 80 extending through the second insulation layer 160 is formed in the TFT region, as shown in FIG. 4f.

S270: on the basis of the step S260, an conductive layer is formed, and by means of a patterning process, the third conductive layer 170 is formed in the lead jumper region, and a common electrode 270 is formed in the pixel region. The third conductive layer 170 is electrically connected to the first portion 151 and the second portion 152 of the second conductive layer 150 via the third via hole 30 and the fourth via hole 40, and the common electrode 270 is connected to the drain electrode 252 in the TFT region via the eighth via hole 80.

In this way, the array substrate having the anti-electrostatic device shown in FIG. 2 for the liquid crystal display may be manufactured. It should be noted that the first portion 151 in the lead jumper region connects a source line to the source electrode 251 in the TFT.

It will be understood by those skilled in the art that, the above-described embodiments are illustrative, and modification may be made thereto by those skilled in the art, the structures described in the various embodiments can be freely combined without conflictions in structure and principle.

While the present disclosure has been described with reference to the accompanying drawings, the embodiments disclosed in the drawings are intended to be illustrative of the optional embodiments of the present disclosure, and are not construed as limiting the present disclosure.

While some embodiments of the present disclosure in accordance with general concept have been illustrated and described, it will be understood by those skilled in the art that changes may be made to these embodiments without departing from the principles and spirits of the general concept of the present disclosure, and the scope of the present disclosure is defined by the claims and their equivalents.

It should be noted that the word "include" or "comprise" does not exclude other elements or steps, the word "a" or "an" does not exclude multiple items. In addition, any reference numerals in the claims should not be construed as limiting the scope of the present disclosure.

What is claimed is:

1. A method for manufacturing an anti-electrostatic device used in an array substrate of a liquid crystal display, comprising steps of:

forming a first insulation layer on a first conductive layer;

forming a pattern on the first insulation layer, the pattern being formed in a same layer as an active layer of a thin film transistor in the array substrate and having an electric conductivity;

forming an etching barrier layer on the pattern;

forming a first via hole and a second via hole extending through the etching barrier layer, and forming a fifth via hole extending through the etching barrier layer and the first insulation layer;

forming a second conductive layer on the etching barrier layer, wherein the second conductive layer is arranged to be at a same layer as a source and drain electrode layer of the thin film transistor in the array substrate, a first portion and a second portion of the second conductive layer are respectively electrically connected to the pattern via the first via hole and the second via hole, and one of the first portion and the second portion of the second conductive layer is electrically connected to the first conductive layer via a fifth via hole.

2. The method according to claim 1, further comprising steps of:

forming a second insulation layer on the second conductive layer;

forming a third via hole and a fourth via hole extending through the second insulation layer; and forming a third conductive layer on the second insulation layer, wherein the third conductive layer is electrically connected to the first portion and the second portion of the second conductive layer via the third via hole and the fourth via hole respectively.

3. The method according to claim 1, wherein the first portion and the second portion of the second conductive layer are simultaneously formed on the etching barrier layer by one patterning process.

4. The method according to claim 1, wherein the pattern in the anti-electrostatic device is synchronously formed while the active layer of the thin film transistor is manufactured.

5. The method according to claim 2, wherein the first insulation layer and the second insulation layer are protective passivation layers made of an inorganic insulation material.

6. The method according to claim 5, wherein the first insulation layer and the second insulation layer are made of silicon dioxide, silicon nitride, silicon oxynitride, aluminum oxide or titanium oxide.

7. The method according to claim 1, wherein the pattern is made of an oxide semiconductor material.

8. The method according to claim 7, wherein the pattern is made of indium gallium zinc oxide, indium gallium tin oxide or indium zinc oxide.

9. An anti-electrostatic device used in an array substrate of a liquid crystal display, comprising:

a first conductive layer;

a first insulation layer formed on the first conductive layer;

a pattern formed on the first insulation layer, the pattern being formed in a same layer as an active layer of a thin film transistor in the array substrate and having an electric conductivity;

an etching barrier layer formed on the pattern;

a second conductive layer formed on the etching barrier layer and comprising a first portion and a second portion spaced apart from each other, the second conductive layer is arranged to be at a same layer as a source and drain electrode layer of the thin film transistor in the array substrate;

wherein the first portion and the second portion of the second conductive layer are respectively electrically connected to the pattern via a first via hole and a second via hole formed in the etching barrier layer;

wherein one of the first portion and the second portion of the second conductive layer is electrically connected to the first conductive layer via a fifth via hole extending through the etching barrier layer and the first insulation layer.

10. The anti-electrostatic device according to claim 9, further comprising:

a second insulation layer formed on the second conductive layer; and a third conductive layer formed on the second insulation layer, wherein the first portion and the second portion of the second conductive layer are respectively electrically connected to the third conductive layer via a third via hole and a fourth via hole formed in the second insulation layer.

11. The anti-electrostatic device according to claim 10, wherein the third conductive layer is a transparent conductive layer made of indium tin oxide.

12. The anti-electrostatic device according to claim 10, wherein the first insulation layer and the second insulation layer are protective passivation layers made of an inorganic insulation material.

13. The anti-static device according to claim 12, wherein the first insulation layer and the second insulation layer are made of silicon dioxide, silicon nitride, silicon oxynitride, aluminum oxide or titanium oxide.

14. The anti-electrostatic device according to claim 9, wherein the pattern is made of an oxide semiconductor material.

15. The anti-electrostatic device according to claim 14, wherein the pattern is made of indium gallium zinc oxide, indium gallium tin oxide or indium zinc oxide.

16. The anti-electrostatic device according to claim 9, wherein the anti-electrostatic device is arranged on a substrate comprising the thin film transistor.

17. An array substrate for a liquid crystal display, comprising the anti-electrostatic device according to claim 9.

18. The array substrate according to claim 17, wherein the anti-electrostatic device further comprises:

a second insulation layer formed on the second conductive layer; and a third conductive layer formed on the second insulation layer, wherein the first portion and the second portion of the second conductive layer are respectively electrically connected to the third conductive layer via a third via hole and a fourth via hole formed in the second insulation layer.

19. The array substrate according to claim 18, wherein the third conductive layer is a transparent conductive layer made of indium tin oxide; and the first insulation layer and the second insulation layer are made of silicon dioxide, silicon nitride, silicon oxynitride, aluminum oxide or titanium oxide.

20. The array substrate according to claim 17, wherein the pattern is made of indium gallium zinc oxide, indium gallium tin oxide or indium zinc oxide.

* * * * *